(12) United States Patent
Ishii et al.

(10) Patent No.: US 9,543,144 B2
(45) Date of Patent: Jan. 10, 2017

(54) VAPOR DEPOSITION OF CHALCOGENIDE-CONTAINING FILMS

(71) Applicant: L'Air Liquide, Société Anonyme pour l'Etude et l'Exploitation des Procédés Georges Claude, Paris (FR)

(72) Inventors: Hana Ishii, Seoul (KR); Nathanaelle Schneider, Ostwald (FR); Julien Gatineau, Tsuchiura (JP)

(73) Assignee: L'Air Liquide, Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 105 days.

(21) Appl. No.: 14/587,833

(22) Filed: Dec. 31, 2014

(65) Prior Publication Data

US 2015/0111392 A1 Apr. 23, 2015

(51) Int. Cl.
  *C23C 16/30* (2006.01)
  *H01L 21/02* (2006.01)
  *C23C 16/455* (2006.01)

(52) U.S. Cl.
  CPC ....... *H01L 21/02568* (2013.01); *C23C 16/305* (2013.01); *C23C 16/45553* (2013.01); *H01L 21/0262* (2013.01); *H01L 21/02551* (2013.01)

(58) Field of Classification Search
  CPC .............................. C23C 16/305; C23C 16/306
  See application file for complete search history.

(56) References Cited

U.S. PATENT DOCUMENTS

| | | | | |
|---|---|---|---|---|
| 4,430,188 A | * | 2/1984 | Cohn | C25B 11/0478 204/290.01 |
| 7,638,645 B2 | | 12/2009 | Gordon et al. | |
| 7,838,329 B2 | | 11/2010 | Hunks et al. | |
| 2003/0168001 A1 | * | 9/2003 | Sneh | C23C 16/02 117/86 |
| 2009/0074652 A1 | * | 3/2009 | Dussarrat | C23C 16/305 423/508 |
| 2009/0137100 A1 | | 5/2009 | Xiao et al. | |
| 2009/0256127 A1 | | 10/2009 | Feist et al. | |
| 2009/0299084 A1 | * | 12/2009 | Okubo | C23C 16/305 556/12 |
| 2010/0279011 A1 | * | 11/2010 | Chen | C07F 9/94 427/255.6 |
| 2011/0262660 A1 | * | 10/2011 | Ishii | C23C 16/305 427/569 |
| 2012/0171378 A1 | * | 7/2012 | Xiao | C23C 16/45553 427/255.35 |
| 2013/0210217 A1 | * | 8/2013 | Xiao | C07F 9/902 438/478 |
| 2013/0306927 A1 | * | 11/2013 | Marsh | H01L 45/06 257/2 |

FOREIGN PATENT DOCUMENTS

| | | |
|---|---|---|
| EP | 2 000 561 | 10/2008 |
| WO | WO 2011 056519 | 5/2011 |

OTHER PUBLICATIONS

Knapas, Kjell, et al., "In Situ Reaction Mechanism Studies on Atomic Layer Deposition of Sb2Te3 and GeTe from (Et3Si)2Te and Chlorides". Chemistry of Materials, 2010, 22, 1386-1391.*
Lee, Simon K.C., et al., "Bismuth-Assisted CdSe and CdTe Nanowire Growth on Plastics". Chemistry of Materials, 2010, 22, 77-84.*
Pore, Viljami, et al., "Atomic Layer Deposition of Metal Tellurides and Selenides Using Alkylsilyl Compounds of Tellurium and Selenium." J. Am. Chem. Soc. 2009, 131, 3478-3480.*
Peters, Emily S., et al., "Dual-source chemical vapour deposition of titanium sulfide thin films from tetrakisdimethylamidotitanium and sulfur precursors". Journal of Materials Chemistry, 2004, 14, 3474-4377.*

* cited by examiner

*Primary Examiner* — Bret Chen
(74) *Attorney, Agent, or Firm* — Patricia E. McQueeney

(57) ABSTRACT

Chalcogenide-containing film forming compositions, methods of synthesizing the same, and methods of forming Chalcogenide-containing films on one or more substrates via vapor deposition processes using the Chalcogenide-containing film forming compositions are disclosed.

17 Claims, No Drawings

VAPOR DEPOSITION OF CHALCOGENIDE-CONTAINING FILMS

TECHNICAL FIELD

Disclosed are Chalcogenide-containing film forming compositions, methods of synthesizing the same, and methods of forming Chalcogenide-containing films on one or more substrates via vapor deposition processes using the Chalcogenide-containing film forming compositions.

BACKGROUND

Patent (U.S. Pat. No. 7,638,645) discloses compounds containing metals in the +4 oxidation state bonded to four amidinate ligands, the broad disclosure of metals which includes tellurium. The metal tetra-amidinate compounds may be used to form metal-containing films in a vapor deposition process, exemplary deposition methods being CVD and ALD. The process includes exposing the substrate to a source of nitrogen, and the thin film comprises a metal nitride. The source of nitrogen comprises ammonia.

Patent application (EP2000561A1) discloses formamidinate compounds wherein the metal is chosen from a Group 2 to Group 16, the broad disclosure of which includes Te and Se. It discloses that the numerous formamidinate compounds may be used in ALD and CVD processes to deposit metal or metal oxide or metal nitride or metal silicate or metal silicon oxynitride thin films. The method for depositing films permits the use of a second precursor, the second precursor being any precursor that reacts with the first precursor. Oxygen, ozone, water, peroxide, alcohols, nitrous oxide and ammonia are mentioned as exemplary second precursors.

Document (US2009/137100) discloses a method of forming tellurium-containing film, wherein a silyltellurium precursor is used as a source of tellurium for the alloy film and is reacted with an alcohol during the deposition process using chemical vapor deposition methods at low temperatures. The tellurium precursor being selected from the group consisting of $(R^1R^2R^3Si)_2Te$, $(R^1R^2R^3Si)TeR^4$, $(R^1R^2R^3Si)TeN(R^4R^5)$ where $R^1$, $R^2$, $R^3$, $R^4$ and $R^5$ are individually hydrogen, alkyl groups with 1 to 10 carbons in linear, branched or cyclic form, or an aromatic group. An alcohol with the general formula ROH where R is an alkyl group with 1 to 10 carbon atoms in linear, branched, or cyclic form or an aromatic group, is to be reacted with tellurium precursor to form a tellurium layer. Tellurium nitride films can not be obtained with this method.

Patent application (WO2011/056519) mentions ALD processes for forming Group VA element containing films. Among other processes, ALD for forming nitrogen-containing thin films is provided. In that particular case, the vapor phase reactant N-source may have the formula $[N(AR^1R^2R^3)_xR_{3-x}]$, $[N[A1(X^1R^1R^2R^3)_3][A^2(X^2R^4R^5R^6)_3][A^3(X^3R^7R^8R^9)_3]]$ or $[N[A^1(X^1R^1R^2R^3)_3][A^2(X^2R^4R^5R^6)_3]H]$; wherein x is from 1 to 3, A is Si, Ge or Sn and $R^{1-9}$ can be independently selected to be linear, cyclic, branched or substituted alkyl, alkenyl, alkynyl, hydrogen or ayrl groups. In some embodiments, $R^1$-$R^9$ can be any organic groups containing heteroatoms or can be a halogen atoms. $X^{1-3}$ can be Si, Ge, N or O. Selected examples of N-containing precursors are $N(SiMe_2tBu)_3$, $N(SiH_3)_3$, $N(SiEt_3)_3$ or $N(SiMe_3)_3$. The N-containing precursors may be used in combination with metal precursors selected from the group consisting of elements from Group IIIA to VIA. Concretely, the authors focus on BN, AlN, GaN films.

In particular, they can be used in combination with Te and Se precursors. Te and Se precursors may have the formula $A(SiR^1R^2R^3)_2$, $[R^1R^2R^3X^1]_3$—Si-A-Si—$[X^2R^4R^5R^6]_3$, $R^1R^2R^3Si$—Si-A-Si—$SiR^4R^5R^6$, $R^1$ $R^2N$—Si-A-Si—$NR^3R^4$, $R^1OSi$-A-$SiOR^2$, or $R^1R^2Si$-A-$SiR^3R^4$; wherein A is Te or Se and $R^1$, $R^2$, $R^3$, $R^4$, $R^5$ and $R^6$ are hydrogen, alkyl groups comprising one or more carbon atoms, alkenyl, alkynyl or aryl groups, organic groups containing hydrogen atoms, halogen atoms and $X^1$, $X^2$ can be Si, O, N. Selected examples are $Se(SiMe_2tBu)_2$, $Te(SiEt_3)_2$, $Te(SiMe_3)_2$, $Se(SiEt_3)_2$ or $Se(SiMe_3)_2$. In other embodiments, the Te and Se precursors may also have multiple atoms of Si and Te or Se.

Patent application (US2009/256127) discloses tellurium metal-organic compounds with the general formula $\{RTe-L,\}$ where R represents either substituted β-diketiminato ($\{R'C(NR)CRC(NR)R\}$) or β-ketoiminato ($\{R'COCRC(NR)R\}$) ligands, wherein R' and R may be the same or different and represent a linear or branched C1-C5 alkyl, halogen-substituted linear or branched C1-C7 alkyl, a C1-C4 alkylamide, a C1-C4 alkoxide, an aryl substituted phenyl, or an organosilyl; and each L is independently selected from the group consisting of a hydrocarbon, an oxygen-containing hydrocarbon, a nitrogen-containing hydrocarbon, an amine or polyamine, a bipyridine, a heterocycle containing oxygen or nitrogen, or any combination thereof. It discloses the use of such complexes for the deposition of tellurium nitride, the nitrogen source being ammonia, hydrazine and alkyl derivatives, containing radicals (for instance N., NH., NH~.), NO, N~O, NO~, amines, and any combination thereof.

Patent application (US2009/299084) discloses tellurium metal-organic compounds with the general formulas $\{(XR_1R_2R_3)Te(XR_4R_5R_6)\}$, $\{(-(R_1R_2X)_nTe-)_y\}$, $\{(-(R_1R_2X)_nTe(XR_3R_4)_m)Te-)_y)\}$, $\{Te(XNR_1CR_2R_3CR_4R_5NR_6)\}$, $\{Te(XNR_1CR_2=CR_3NR_4)\}$, wherein X is a carbon, silicon or germanium atom, n,m are selected from 0 to 2, each $R_{1-6}$ is independently selected from among H, a C1-C6 alkyl, a C1-C6 alkoxy, a C1-C6 alkylsilyl, a C1-C6 perfluorocarbon, a C1-C6 alkylsiloxy, a C1-C6 alkylamino an alkylsilylamino and an aminoamido; and the use of those precursors onto the substrate to form a tellurium containing film with $H_2$, $NH_3$, hydrogen radicals; and mixtures thereof as co-reactant.

A need remains for chalcogenide-containing precursor molecules suitable for vapor phase film deposition in thermal mode at low temperatures.

NOTATION AND NOMENCLATURE

Certain abbreviations, symbols, and terms are used throughout the following description and claims, and include:

As used herein, the indefinite article "a" or "an" means one or more.

As used herein, the terms "approximately" or "about" mean ±10% of the value stated.

The standard abbreviations of the elements from the periodic table of elements are used herein. It should be understood that elements may be referred to by these abbreviations (e.g., S refers to Sulfur, Se refers to Selenium Te refers to Tellurium, N refers to nitrogen, C refers to carbon, etc.).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x (NR^2R^3)_{(4-x)}$, where x is 2 or 3, the two or three $R^1$ groups may, but need not be identical to each other or to $R^2$ or to $R^3$.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a "normal" or linear propyl group; the abbreviation "iPr" refers to an isopropyl group; the abbreviation "Bu" refers to a butyl group; the abbreviation "nBu" refers to a "normal" or linear butyl group; the abbreviation "tBu" refers to a tert-butyl group, also known as 1,1-dimethylethyl; the abbreviation "sBu" refers to a sec-butyl group, also known as 1-methylpropyl; the abbreviation "iBu" refers to an iso-butyl group, also known as 2-methylpropyl; the abbreviation "amyl" refers to an amyl or pentyl group; the abbreviation "tAmyl" refers to a tert-amyl group, also known as 1,1-dimethylpropyl.

SUMMARY

Disclosed are processes for the deposition of Chalcogenide-containing films on substrates. A Chalcogenide-containing film forming precursor is introduced into a reactor having a substrate disposed therein. The Chalcogenide-containing film forming precursor has the formula:

$$((R^1R^2R^3)E)M(E(R^4R^5R^6)) \quad (I)$$

$$((R^1R^2)N)_2M \quad (II)$$

$$(RO)_2M \quad (III)$$

wherein M is S, Se, or Te; E is Si or Ge; and each R is independently selected from H, a linear or branched C1-C6 alkyl, C1-C6 alkoxy, C1-C6 alkylsilyl, C1-C6 alkygermyl, C1-C6 perfluorocarbon, C1-C6 alkylsiloxy, C1-C6 alkylamino, alkylsilylamino, or aminoamido group. At least part of the precursor is deposited onto the substrate to form the Chalcogenide-containing film. The disclosed processes may further include one or more of the following aspects:

the chalcogenide-containing film forming precursor having the formula (I) $((R^1R^2R^3)E)M(E(R^4R^5R^6))$;

the precursor being $(Me_3Ge)_2Te$, $(Et_3Ge)_2Te$, $(Pr_3Ge)_2Te$, $(BuMe_2Ge)_2Te$, $(Me_3Si)_3Ge]Te(SiMe_3)$, $[(Me_3Si)_3Si]Te(GeMe_3)$, $[(Me_3Si)_3Ge]Te(GeMe_3)$, $(H_3Ge)Te(SiH_3)$, $(Me_3Ge)Te(SiMe_3)$, $(Pr_3Ge)Te(SiPr_3)$, $(Me_3Ge)_2Se$, $(Et_3Ge)_2Se$, $(Pr_3Ge)_2Se$, $(BuMe_2Ge)_2Se$, $(Me_3Si)_3GeSeSiMe_3$, $(Me_3Si)_3SiSeGeMe_3$, $(Me_3Si)_3GeSeGeMe_3$, $Pr_3GeSeSiPr_3$, $(Me_3Ge)_2S$, $(Et_3Ge)_2S$, $(Pr_3Ge)_2S$, $(BuMe_2Ge)_2S$, $(Me_3Si)_3GeSSiMe_3$, $(Me3Si)3SiSGeMe3$, $((Me_3Si)_3GeSGeMe_3$, or $Pr_3GeSSiPr_3$;

the chalcogenide-containing film forming precursor having the formula (II) $((R^1R^2)N)_2M$;

the precursor being $Te(NH(SiMe_3))_2$, $Se(NH(SiMe_3))_2$, or $S(NH(SiMe_3))_2$;

the chalcogenide-containing film forming precursor having the formula $(RO)_2M$;

the precursor being $(MeO)_2Te$, $(EtO)_2Te$, $(iPrO)_2Te$, $(BuO)_2Te$, $(MeO)_2Se$, $(EtO)_2Se$, $(iPrO)_2Se$, $(BuO)_2Se$, $(MeO)_2S$, $(EtO)_2S$, $(iPrO)_2S$, or $(BuO)_2S$;

introducing a reactant into the reactor;

the reactant being selected from the group consisting of nitrogen trifluoride ($NF_3$), nitrogen trichloride ($NCl_3$), chloramide ($NH_2Cl$), $IN_3$, fluorimide ($NHF_2$), dichlorodiazene ($N_2Cl_4$), $N(CF_3)_3$, nitrogen chloride difluoride ($NF_2Cl$), perfluoroammonium salts, $N_2OF$, NOF, $NOCF_3$, $NO_2Cl$, nitrogen trifluoride oxide ($NOF_3$), methylamine ($N(CH_3)H_2$), dimethylamine ($N(CH_3)_2H$), trimethylamine ($N(CH_3)_3$), ethylamine ($N(C_2H_5)H_2$), diethylamine ($N(C_2H_5)_2H$), triethylamine ($N(C_2H_5)_3$), tertbutylamine ($NH_2C(CH_3)_3$), ethylendiamine ($C_2H_4(NH_2)_2$), allylamine ($NH_2CH_2CHCH_2$), hydrazine ($N_2H_4$), methyl hydrazine ($CH_3$)$HNNH_2$, dimethyl hydrazine ($CH_3$)$_2NNH_2$, hydrazides, amidine derivatives, $CH_3N_3$, $NaN_3$, $HN_3$, alkyl diazenes (RN=NR), azomethane ($CH_3N$=$NCH_3$), cyanates, isocyanate derivatives, $[N(SiR'_3)R''_{3-x}]$ wherein each R', R'' is independently selected from H, linear or branched C1-C6 alkyl, and x is from 1 to 3, $(N(SiH_3)_3)$, $(SiMe_3)_2NH$, radical species thereof, and combinations thereof;

the Chalcogenide-containing precursor and the reactant being introduced into the reactor substantially simultaneously;

the reactor being configured for chemical vapor deposition;

the reactor being configured for plasma enhanced chemical vapor deposition;

the Chalcogenide-containing precursor and the reactant being introduced into the chamber sequentially;

the reactor being configured for atomic layer deposition; and the reactor being configured for plasma enhanced atomic layer deposition.

DESCRIPTION OF PREFERRED EMBODIMENTS

Disclosed are Chalcogenide-containing film forming compositions comprising precursors having one of the following formulae:

$$((R^1R^2R^3)E)M(E(R^4R^5R^6)) \quad (I)$$

$$((R^1R^2)N)_2M \quad (II)$$

$$(RO)_2M \quad (III)$$

wherein, M is S, Se, or Te; E is Si or Ge; and each R is independently selected from H, a linear or branched C1-C6 alkyl, C1-C6 alkoxy, C1-C6 alkylsilyl, C1-C6 alkygermyl, C1-C6 perfluorocarbon, C1-C6 alkylsiloxy, C1-C6 alkylamino, alkylsilylamino, or aminoamido group.

The precursor may have the formula (I) $((R^1R^2R^3)E)M(E(R^4R^5R^6))$:

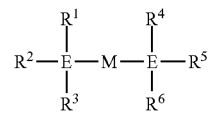

Exemplary precursors having formula (I) include (Me$_3$Ge)$_2$Te, (Et$_3$Ge)$_2$Te, (Pr$_3$Ge)$_2$Te, (BuMe$_2$Ge)$_2$Te, (Me$_3$Si)$_3$Ge]Te(SiMe$_3$), [(Me$_3$Si)$_3$Si]Te(GeMe$_3$), [(Me$_3$Si)$_3$Ge]Te(GeMe$_3$), (H$_3$Ge)Te(SiH$_3$), (Me$_3$Ge)Te(SiMe$_3$), (Pr$_3$Ge)Te(SiPr$_3$), (Me$_3$Ge)$_2$Se, (Et$_3$Ge)$_2$Se, (Pr$_3$Ge)$_2$Se, (BuMe$_2$Ge)$_2$Se, (Me$_3$Si)$_3$GeSeSiMe$_3$, (Me$_3$Si)$_3$SiSeGeMe$_3$, (Me$_3$Si)$_3$GeSeGeMe$_3$, Pr$_3$GeSeSiPr$_3$, (Me$_3$Ge)$_2$S, (Et$_3$Ge)$_2$S, (Pr$_3$Ge)$_2$S, (BuMe$_2$Ge)$_2$S, (Me$_3$Si)$_3$GeSSiMe$_3$, (Me$_3$Si)$_3$SiSGeMe$_3$, ((Me$_3$Si)$_3$GeSGeMe$_3$, or Pr$_3$GeSSiPr$_3$.

These precursors may be synthesized by reacting A$_2$M with ER$^1$R$^2$R$^3$Cl and ER$^4$R$^5$R$^6$Cl, wherein A is sodium, potassium, or lithium.

The precursor may have the formula (II) ((R$^1$R$^2$)N)$_2$M:

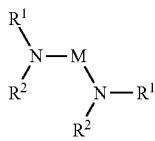

Exemplary precursors having formula (II) include Te(NH(SiMe$_3$))$_2$, Se(NH(SiMe$_3$))$_2$, or S(NH(SiMe$_3$))$_2$, Te(N(SiMe$_3$)$_2$)$_2$, Te(N(SiEt$_3$)$_2$)$_2$, Te(N(SitBuMe$_2$)$_2$)$_2$, Te(N(SiH$_3$)$_2$)$_2$, Se(N(SiMe$_3$)$_2$)$_2$, Se(N(SiEt$_3$)$_2$)$_2$, Se(N(SitBuMe$_2$)$_2$)$_2$, Se(N(SiH$_3$)$_2$)$_2$; S(N(SiMe$_3$)$_2$)$_2$, S(N(SiEt$_3$)$_2$)$_2$, S(N(SitBuMe$_2$)$_2$)$_2$, or S(N(SiH$_3$)$_2$)$_2$. Preferably, the precursors having formula (II) are Te(NH(SiMe$_3$))$_2$, Se(NH(SiMe$_3$))$_2$, or S(NH(SiMe$_3$))$_2$.

These precursors may be synthesized by reacting A(NR$^1$R$^2$) with MX$_2$, wherein A is Na, K, or Li and X is Cl, Br, I, or triflate (SO$_3$CF$_3$).

The precursor may have the formula (III) (RO)$_2$M:

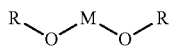

Exemplary precursors having formula (III) include (MeO)$_2$Te, (EtO)$_2$Te, (iPrO)$_2$Te, (BuO)$_2$Te, (MeO)$_2$Se, (EtO)$_2$Se, (iPrO)$_2$Se, (BuO)$_2$Se, (MeO)$_2$S, (EtO)$_2$S, (iPrO)$_2$S, or (BuO)$_2$S.

These precursors may be synthesized by reacting A(OR) with MX$_2$, wherein A is Na, K, or Li and X is Cl, Br, I, or triflate (SO$_3$CF$_3$).

Purity of the disclosed chalcogenide-containing film forming composition is preferably higher than 99.9% w/w. The disclosed chalcogenide-containing film forming compositions may contain any of the following impurities: alkylamines; alkylimines; THF; ether; pentane; cyclohexane; heptane; benzene; toluene; halogenated metal compounds; alkali metal compounds; lithium, sodium or potassium alkoxy; or lithium, sodium or potassium alkylamino. Preferably, the total quantity of these impurities is below 0.1% w/w. The composition may be purified by recrystallisation, sublimation, distillation, and/or passing the gas or liquid through a suitable adsorbent, such as a 4A molecular sieve.

Purification of the disclosed chalcogenide-containing film forming composition may also result in elemental impurities at the 1 ppbw to 1 ppmw, preferably 1-500 ppbw (part per billion weight) level. These elemental impurities include, but are not limited to, Aluminum (Al), Arsenic (As), Barium (Ba), Beryllium (Be), Bismuth (Bi), Carbon (C), Cadmium (Cd), Calcium (Ca), Chlorine (Cl), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nitrogen (N), Nickel (Ni), Potassium (K), Silicon (Si), Sodium (Na), Strontium (Sr), Thorium (Th), Tin (Sn), Titanium (Ti), Uranium (U), and Zinc (Zn).

Also disclosed are methods for forming chalcogenide-containing layers on a substrate using a vapor deposition process. The method may be useful in the manufacture of semiconductor, photovoltaic, LCD-TFT, or flat panel type devices. The disclosed chalcogenide-containing film forming compositions may be used to deposit Chalcogenide-containing films using any deposition methods known to those of skill in the art.

Examples of suitable vapor deposition methods include chemical vapor deposition (CVD) or atomic layer deposition (ALD). Exemplary CVD methods include thermal CVD, plasma enhanced CVD (PECVD), pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

Applicants believe that the disclosed chalcogenide-containing film forming compositions enable vapor deposition of sulfur nitride, selenium nitride, or tellurium nitride films with controlled thickness and composition at relatively low temperature.

The disclosed Chalcogenide-containing film forming compositions may be supplied either in neat form or in a blend with a suitable solvent, such as ethyl benzene, xylene, mesitylene, decalin, decane, dodecane. The disclosed precursors may be present in varying concentrations in the solvent.

The neat or blended Chalcogenide-containing film forming compositions are introduced into a reactor in vapor form by conventional means, such as tubing and/or flow meters. The vapor form may be produced by vaporizing the neat or blended composition through a conventional vaporization step such as direct vaporization, distillation, or by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling the carrier gas into the composition. The carrier gas may include, but is not limited to, Ar, He, N$_2$, and mixtures thereof. Bubbling with a carrier gas may also remove any dissolved oxygen present in the neat or blended composition. The carrier gas and composition are then introduced into the reactor as a vapor.

If necessary, the container containing the disclosed composition may be heated to a temperature that permits the composition to be in its liquid phase and to have a sufficient vapor pressure. The container may be maintained at temperatures in the range of, for example, approximately 0° C. to approximately 150° C. Those skilled in the at recognize that the temperature of the container may be adjusted in a known manner to control the amount of precursor vaporized.

The reactor may be any enclosure or chamber within a device in which deposition methods take place such as without limitation, a parallel-plate type reactor, a cold-wall type reactor, a hot-wall type reactor, a single-wafer reactor, a multi-wafer reactor, or other types of deposition systems under conditions suitable to cause the compounds to react and form the layers. One of ordinary skill in the art will recognize that any of these reactors may be used for either ALD or CVD deposition processes.

The reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (SiCOH) layers, or combinations thereof. Additionally, the wafers may include copper layers or noble metal layers (e.g. platinum, palladium, rhodium, or gold). The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. The disclosed processes may deposit the Chalcogenide-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. For example, a Tellurium film may be deposited onto a Cu layer to form a copper telluride film. Alternatively, a Tellurium film may be deposited on a Mo coated soda lime glass substrate.

The temperature and the pressure within the reactor are held at conditions suitable for vapor depositions. In other words, after introduction of the vaporized composition into the chamber, conditions within the chamber are such that at least part of the precursor is deposited onto the substrate to form a Chalcogenide-containing film. For instance, the pressure in the reactor may be held between about 1 Pa and about $10^5$ Pa, more preferably between about 25 Pa and about $10^3$ Pa, as required per the deposition parameters. Likewise, the temperature in the reactor may be held between about 0° C. and about 400° C., preferably between about 20° C. and about 350° C. One of ordinary skill in the art will recognize that "at least part of the precursor is deposited" means that some or all of the precursor reacts with or adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 0° C. to approximately 400° C. When a plasma deposition process is utilized, the deposition temperature may range from approximately 0° C. to approximately 350° C. Alternatively, when a thermal process is performed, the deposition temperature may range from approximately 20° C. to approximately 400° C.

In addition to the disclosed compound, a reactant may also be introduced into the reactor. The reactant may be nitrogen trifluoride ($NF_3$), nitrogen trichloride ($NCl_3$), chloramide ($NH_2Cl$), $IN_3$, fluorimide ($NHF_2$), dichlorodiazene ($N_2Cl_4$), $N(CF_3)_3$, nitrogen chloride difluoride ($NF_2Cl$), perfluoroammonium salts, $N_2OF$, NOF, $NOCF_3$, $NO_2Cl$, nitrogen trifluoride oxide ($NOF_3$), methylamine ($N(CH_3)H_2$), dimethylamine ($N(CH_3)_2H$), trimethylamine ($N(CH_3)_3$), ethylamine ($N(C_2H_5)H_2$), diethylamine ($N(C_2H_5)_2H$), triethylamine ($N(C_2H_5)_3$), tertbutylamine ($NH_2C(CH_3)_3$), ethylendiamine ($C_2H_4(NH_2)_2$), allylamine ($NH_2CH_2CHCH_2$), hydrazine ($N_2H_4$), methyl hydrazine ($CH_3)HNNH_2$, dimethyl hydrazine ($CH_3)_2NNH_2$, hydrazides, amidine derivatives, $CH_3N_3$, $NaN_3$, $HN_3$, alkyl diazenes (RN=NR), azomethane ($CH_3N=NCH_3$), cyanates, isocyanate derivatives, $[N(SiR'_3)R''_{3-x}]$ wherein each R', R" is independently selected from H, linear or branched C1-C6 alkyl, and x is from 1 to 3, $(N(SiH_3)_3)$, $(SiMe_3)_2NH$, radical species thereof, and combinations thereof. Preferably, the reactant is selected from the group consisting of $NF_3$, $NCl_3$, $NH_3$, or $N(SiH_3)_3$, and mixtures thereof.

The reactant may be treated by a plasma, in order to decompose the reactant into its radical form. $N_2$ may also be utilized as a nitrogen source gas when treated with plasma. For instance, the plasma may be generated with a power ranging from about 50 W to about 500 W, preferably from about 100 W to about 400 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

For example, the reactant may be introduced into a direct plasma reactor, which generates plasma in the reaction chamber, to produce the plasma-treated reactant in the reaction chamber. Exemplary direct plasma reactors include the Titan™ PECVD System produced by Trion Technologies. The reactant may be introduced and held in the reaction chamber prior to plasma processing. Alternatively, the plasma processing may occur simultaneously with the introduction of the reactant. In-situ plasma is typically a 13.56 MHz RF inductively coupled plasma that is generated between the showerhead and the substrate holder. The substrate or the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the reactant using in-situ plasma is typically less than achieved using a remote plasma source for the same power input and is therefore not as efficient in reactant disassociation as a remote plasma system, which may be beneficial for the deposition of Chalcogenide-containing films on substrates easily damaged by plasma.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10

Torr, the reactant $NF_3$ may be decomposed into N. and F. radicals. Preferably, the remote plasma may be generated with a power ranging from about 1 kW to about 10 kW, more preferably from about 2.5 kW to about 7.5 kW.

The vapor deposition conditions within the chamber allow the disclosed composition and the reactant to react and form a Chalcogenide-containing film on the substrate. In some embodiments, Applicants believe that plasma-treating the reactant may provide the reactant with the energy needed to react with the disclosed composition.

Applicants believe that the combined use of the disclosed chalcogenide-containing film forming compositions and these N-containing reactants permit deposition of chalcogenide-containing nitride films at low temperatures in thermal mode with high growth rate and good quality (low to no O, C, or other impurities).

Applicants also believe that the combination of the disclosed chalcogenide-containing precursors with N-containing reactants produce reduction-oxidation reactions. As a result, the deposition processes will involve the reaction of an oxidative species with a reductive species and attention shall be paid to the oxidation states of each reacting atoms. However, one should keep in mind that oxidation states may be just nominal or formal expressions, in reality the situation might be more complex.

Applicants also believe that the reactions may result in the recombination of chemical groups to form new chemical bonds and molecules, the stability of which may be predicted using the Hard-Soft-Acid-base theory ("HSAB theory"). For instance, $(R_3Si)_2M$ and $(R_3Ge)_2M$ precursors react with N/halogen molecules so that the silicon or germanium atom is bonded to a harder base within the deposition reaction.

In the case of sulfur, selenium or tellurium atoms bonded to silicon atoms, the preferred co-reactants are fluorine-containing precursors such as $NF_3$ or difluorodiazene (FN=NF) because the F—Si bond is known to be one of the most stable chemical bonds. The resulting formation of Si—F chemical bonds may help contribute to deposition of the S, Se, or Te atom in the chalcogenide film.

Alternatively, the reactant may be an oxidizing agent, such as one of $O_2$, $O_3$, $H_2O$, $H_2O_2$; oxygen containing radicals, such as O. or OH., NO, $NO_2$; carboxylic acids such as formic acid, acetic acid, propionic acid, radical species of NO, $NO_2$, or the carboxylic acids; para-formaldehyde; and mixtures thereof. Preferably, the oxidizing agent is selected from the group consisting of $O_2$, $O_3$, $H_2O$, $H_2O_2$, oxygen containing radicals thereof such as O. or OH., and mixtures thereof. Preferably, when an ALD process is performed, the reactant is plasma treated oxygen, ozone, or combinations thereof. When an oxidizing agent is used, the resulting chalcogen containing film will also contain oxygen.

Depending on what type of film is desired to be deposited, an additional precursor compound may be introduced into the reactor. The precursor may be used to provide additional elements to the chalcogenide-containing film. The additional elements may include bismuth, cadmium, copper, indium, zinc, lanthanides (Ytterbium, Erbium, Dysprosium, Gadolinium, Praseodymium, Cerium, Lanthanum, Yttrium), zirconium, germanium, silicon, magnesium, titanium, manganese, ruthenium, lead, magnesium, aluminum, or mixtures of these. When an additional precursor compound is utilized, the resultant film deposited on the substrate contains the chalcogenide element in combination with at least one additional element.

The Chalcogenide-containing film forming composition and reactants may be introduced into the reactor either simultaneously (chemical vapor deposition), sequentially (atomic layer deposition) or different combinations thereof. The reactor may be purged with an inert gas between the introduction of the compositions and the introduction of the reactants. Alternatively, the reactants and the compositions may be mixed together to form a reactant/composition mixture, and then introduced to the reactor in mixture form. Another example is to introduce the reactant continuously and to introduce the Chalcogenide-containing film forming composition by pulse (pulsed chemical vapor deposition).

The vaporized composition and the reactant may be pulsed sequentially or simultaneously (e.g. pulsed CVD) into the reactor. Each pulse of composition may last for a time period ranging from about 0.01 seconds to about 10 seconds, alternatively from about 0.3 seconds to about 3 seconds, alternatively from about 0.5 seconds to about 2 seconds. In another embodiment, the reactant may also be pulsed into the reactor. In such embodiments, the pulse of each may last for a time period ranging from about 0.01 seconds to about 10 seconds, alternatively from about 0.3 seconds to about 3 seconds, alternatively from about 0.5 seconds to about 2 seconds. In another alternative, the vaporized compositions and reactants may be simultaneously sprayed from a shower head under which a susceptor holding several wafers is spun (spatial ALD).

Depending on the particular process parameters, deposition may take place for a varying length of time. Generally, deposition may be allowed to continue as long as desired or necessary to produce a film with the necessary properties. Typical film thicknesses may vary from several angstroms to several hundreds of microns, depending on the specific deposition process. The deposition process may also be performed as many times as necessary to obtain the desired film.

In one non-limiting exemplary CVD type process, the vapor phase of the disclosed Chalcogenide-containing film forming composition and a reactant are simultaneously introduced into the reactor. The two react to form the resulting Chalcogenide-containing film. When the reactant in this exemplary CVD process is treated with a plasma, the exemplary CVD process becomes an exemplary PECVD process. The reactant may be treated with plasma prior or subsequent to introduction into the chamber.

In one non-limiting exemplary ALD type process, the vapor phase of the disclosed Chalcogenide-containing film forming composition is introduced into the reactor, where it is contacted with a suitable substrate. Excess composition may then be removed from the reactor by purging and/or evacuating the reactor. A reactant (for example, $NF_3$) is introduced into the reactor where it reacts with the absorbed composition in a self-limiting manner. Any excess reactant is removed from the reactor by purging and/or evacuating the reactor. If the desired film is a Chalcogenide nitride film, this two-step process may provide the desired film thickness or may be repeated until a film having the necessary thickness has been obtained.

Alternatively, if the desired film contains the Chalcogenide transition metal and a second element, the two-step process above may be followed by introduction of the vapor of an additional precursor compound into the reactor. The additional precursor compound will be selected based on the nature of the Chalcogenide-containing film being deposited. After introduction into the reactor, the additional precursor compound is contacted with the substrate. Any excess precursor compound is removed from the reactor by purging and/or evacuating the reactor. Once again, a reactant may be introduced into the reactor to react with the precursor compound. Excess reactant is removed from the reactor by purging and/or evacuating the reactor. If a desired film thickness has been achieved, the process may be terminated. However, if a thicker film is desired, the entire four-step process may be repeated. By alternating the provision of the Chalcogenide-containing film forming composition, additional precursor compound, and reactant, a film of desired composition and thickness can be deposited.

When the reactant in this exemplary ALD process is treated with a plasma, the exemplary ALD process becomes an exemplary PEALD process. The reactant may be treated with plasma prior or subsequent to introduction into the chamber.

The Chalcogenide-containing films resulting from the processes discussed above may include a Chalcogen nitride $(M_nN_m)$, such as poly sulfur nitride $(SN)_n$, $Se_4N_4$ or TeN; chalcogen oxide $(M_nO_m)$, such as $SeO_2$ or $TeO_2$; bismuth chalcogen $(Bi_mM_n)$, such as $Bi_2S_3$, $Bi_2Se_3$ or $Bi_2Te_3$; cadmium chalcogen $(Cd_mM_n)$, such as CdS, CdSe, or CdTe; copper chalcogen $(Cu_mM_n)$, such as $CuTe_2$ or $CuSe_2$: copper indium chalcogen $(Cu_mIn_nM_o)$, such as $CuInTe_2$ or $CuInSe_2$; copper indium gallium chalcogen $(Cu_mIn_nGa_oM_p)$, such as $CuInGaSe_2$; copper zinc tin chalcogen, such as $Cu_2ZnSnS_4$, $Cu_2ZnSnSe_4$, or $Cu_2ZnSn(S_{1-n}Se_n)$; zinc chalcogen $(Zn_mM_n)$, such as ZnS, ZnSe, or ZnTe; zirconium chalcogen oxide $(Zr_mM_nO_p)$, such as zirconium sulfur oxide (ZrSO); chalcogen doped microcrystalline diamond, such as sulfur doped microcrystalline diamond thin film; wherein M is S, Se, or Te and m, n, o, and p are integers which inclusively range from 1 to 6. One of ordinary skill in the art will recognize that by judicial selection of the appropriate disclosed compound, optional precursor compounds, and reactant species, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the Chalcogenide-containing film may be exposed to a temperature ranging from approximately 200° C. and approximately 1000° C. for a time ranging from approximately 0.1 second to approximately 7200 seconds under an inert atmosphere, an O-containing atmosphere, or combinations thereof. Most preferably, the temperature is 400° C. for 3600 seconds under an inert atmosphere or an O-containing atmosphere. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the Chalcogenide-containing film. This in turn tends to improve the resistivity of the film.

In another alternative, the disclosed chalcogenide-containing precursor may be used as doping or implantation agents. Part of the disclosed precursor may be deposited on top of the film to be doped, such as a cubic boron nitride (BN), copper oxide $(Cu_2O)$ film, copper indium (CuIn) film, a gallium selenide (GaSe) film, or a molybdenum disulfide $(MoS_2)$. The chalcogenide then diffuses into the film during an annealing step to form the chalcogenide-doped films {(S)BN, $(S)Cu_2O$, (Te)CuIn, (Te)GaSe, $(Te)MoS_2$}. See, e.g., US2008/0241575 to Lavoie et al., the doping method of which is incorporated herein by reference in its entirety. Alternatively, high energy ion implantation using a variable energy radio frequency quadrupole implanter may be used to dope the chalcogenide of the disclosed precursors into a film. See, e.g., Kensuke et al., JVSTA 16(2) March/April 1998, the implantation method of which is incorporated herein by reference in its entirety. In another alternative, plasma doping, pulsed plasma doping or plasma immersion ion implantation may be performed using the disclosed precursors. See, e.g., Felch et al., Plasma doping for the fabrication of ultra-shallow junctions Surface Coatings Technology, 156 (1-3) 2002, pp. 229-236, the doping method of which is incorporated herein by reference in its entirety.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

We claim:

1. A method of forming a chalcogenide-containing film, the method comprising introducing into a reactor having a substrate therein a vapor of a chalcogenide-containing film forming precursor having the following formula:

$$(RO)_2M$$

wherein, M is S, Se, or Te; E is Si or Ge; and R is independently selected from H, a linear or branched C1-C6 alkyl, C1-C6 alkoxy, C1-C6 alkylsilyl, C1-C6 alkygermyl, C1-C6 perfluorocarbon, C1-C6 alkylsiloxy, C1-C6 alkylamino, alkylsilylamino, or aminoamido group; and depositing at least part of the chalcogenide-containing film forming precursor onto the substrate.

2. The method of claim 1, wherein the precursor is selected from the group consisting of $(MeO)_2Te$, $(EtO)_2Te$, $(iPrO)_2Te$, $(BuO)_2Te$, $(MeO)_2Se$, $(EtO)_2Se$, $(iPrO)_2Se$, $(BuO)_2Se$, $(MeO)_2S$, $(EtO)_2S$, $(iPrO)_2S$, and $(BuO)_2S$.

3. The method of claim 2, wherein the precursor is $(MeO)_2Te$, $(EtO)_2Te$, $(iPrO)_2Te$, or $(BuO)_2Te$.

4. The method of claim 3, wherein the precursor is $(MeO)_2Te$.

5. The method of claim 3, wherein the precursor is $(EtO)_2Te$.

6. The method of claim 3, wherein the precursor is $(iPrO)_2Te$.

7. The method of claim 3, wherein the precursor is $(BuO)_2Te$.

8. The method of claim 2, wherein the precursor is $(MeO)_2Se$, $(EtO)_2Se$, $(iPrO)_2Se$, or $(BuO)_2Se$.

9. The method of claim 8, wherein the precursor is $(MeO)_2Se$.

10. The method of claim 8, wherein the precursor is $(EtO)_2Se$.

11. The method of claim 8, wherein the precursor is $(iPrO)_2Se$.

12. The method of claim 8, wherein the precursor is $(BuO)_2Se$.

13. The method of claim 2, wherein the precursor is $(MeO)_2S$, $(EtO)_2S$, $(iPrO)_2S$, or $(BuO)_2S$.

14. The method of claim 13, wherein the precursor is $(MeO)_2S$.

15. The method of claim 13, wherein the precursor is $(EtO)_2S$.

16. The method of claim 13, wherein the precursor is (iPrO)$_2$S.

17. The method of claim 13, wherein the precursor is (BuO)$_2$S.

* * * * *